United States Patent [19]

Reed

[11] 4,216,387
[45] Aug. 5, 1980

[54] SAWTOOTH WAVEFORM GENERATOR

[76] Inventor: Lockwood W. Reed, Middletown, N.J.

[21] Appl. No.: 862,413

[22] Filed: Dec. 20, 1977

Related U.S. Application Data

[63] Continuation-in-part of Ser. No. 700,144, Jun. 28, 1976, abandoned.

[51] Int. Cl.$^2$ ............................................. H03K 4/50
[52] U.S. Cl. .................................. 307/228; 307/261; 328/183
[58] Field of Search ............... 307/228, 261, 263, 256, 307/259; 328/35, 36, 181–185; 331/111

[56] References Cited

U.S. PATENT DOCUMENTS 3,749,939   7/1973   Kuijk et al. .................. 307/228 X

*Primary Examiner*—John Zazworsky

[57] ABSTRACT

Device for the generation of a Sawtooth Waveform. The sawtooth Waveform being derived from two triangular waveforms. The two triangular waveforms maintain a phase difference of 180°, so that at any instant of time one of the triangular waveforms will have a positive slope. A sawtooth, of positive slope, is generated by repeatedly switching, the device output, from a triangular waveform, at the termination of its positive slope, to the triangular waveform with the coincidently commensing positive slope.

9 Claims, 5 Drawing Figures

SAWTOOTH WAVEFORM GENERATOR

This is a continuation-in-part of application Ser. No. 700,144, filed June 28, 1976 now abandoned.

The invention relates to a device for the generation of a sawtooth waveform with an extra-ordinary short transition time from the termination of the sawtooth ramp to the start of the sawtooth ramp. In addition, the device provides a means by which the main timing element, a capacitor, is not subjected to a current, during the transition time, which exceeds the current necessary to produce the sawtooth ramp.

A sawtooth waveform, with such attributes, would be of great advantage, for example, if used for the generation of a sweep voltage for an oscilloscope or display.

The sawtooth waveform generated by this device is derived from two triangular waveforms, which maintain a phase difference of 180°. A sawtooth, of positive slope, is generated by repeatedly switching, the device output to the triangle output beginning its positive slope.

The output of a single triangle waveform generator is phase inverted by a suitable means, to produce the two phase opposed triangle waveforms. Level sensing circuitry, at the output of the triangle generator, symmetrically detects and limits the output of the triangle generator, and produces an output, the polarity of which, is dependent on either the minimum or maximum level of the triangle being detected. The level detector provides the switching timing signal to alternately switch the device output, from the triangle terminating its positive slope, to the triangle coincidently beginning its positive slope. The circuitry which performs the output switching function is a diode matrix which offers an inherent speed advantage over previous art (U.S. Pat. No. 3,749,939) which uses active devices, such as transistors, to perform a switching or multiplying function. Diode switching speeds of 100 pico-seconds are not considered uncommon.

A second inherent advantage, in this method of sawtooth generation, is that the positive and negative slopes of the triangle are independently generated and as these slopes are alternately switched to the sawtooth output, a dual channel oscilloscope can have two independent time bases from essentially a single sweep circuit.

Embodiments of the invention will now be described, by way of example, with reference to the accompanying diagrammatic drawings, in which.

Figure 3:
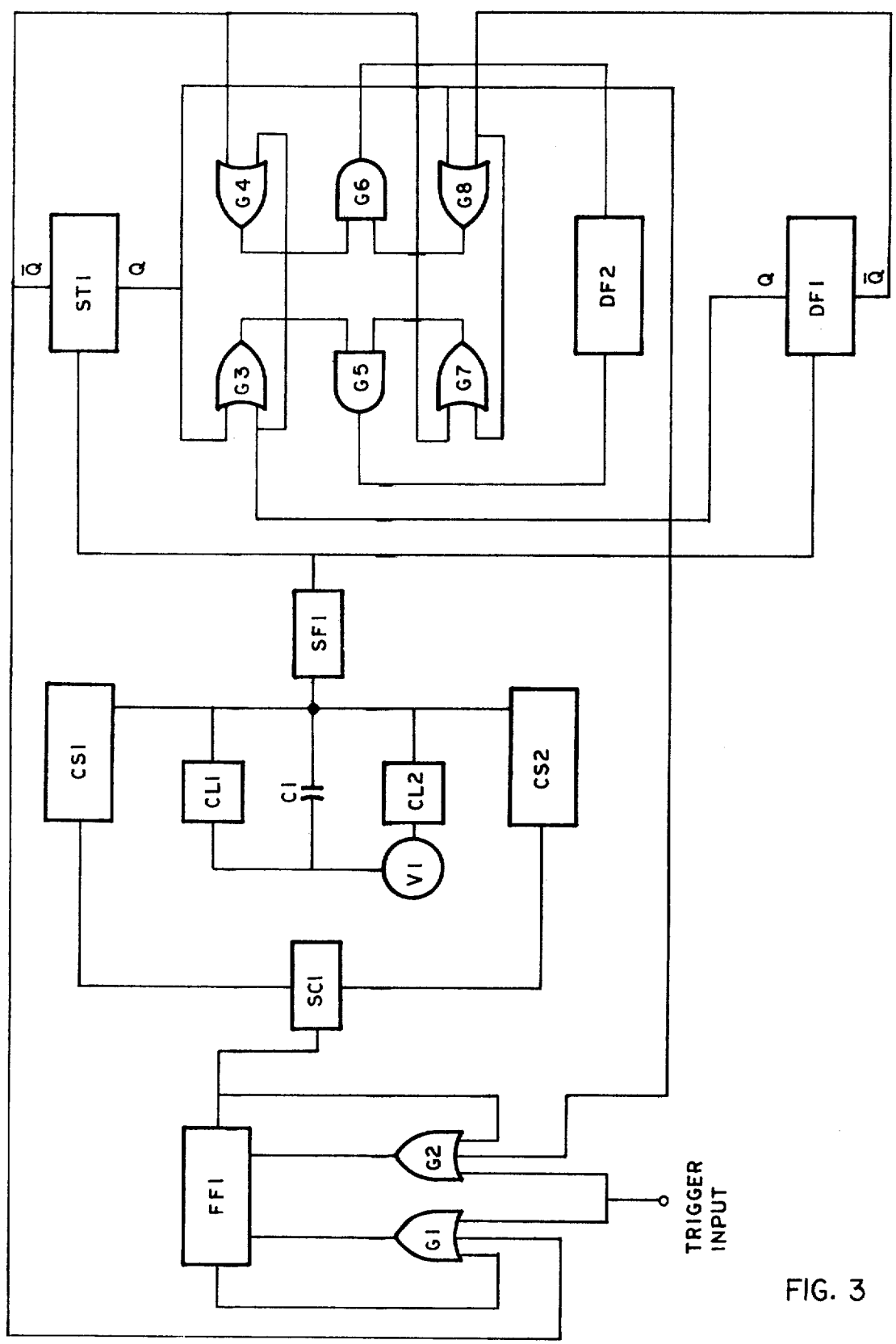
FIG. 3 is a block-schematic diagram showing the embodiment of the sawtooth waveform generator.
Figure 4:
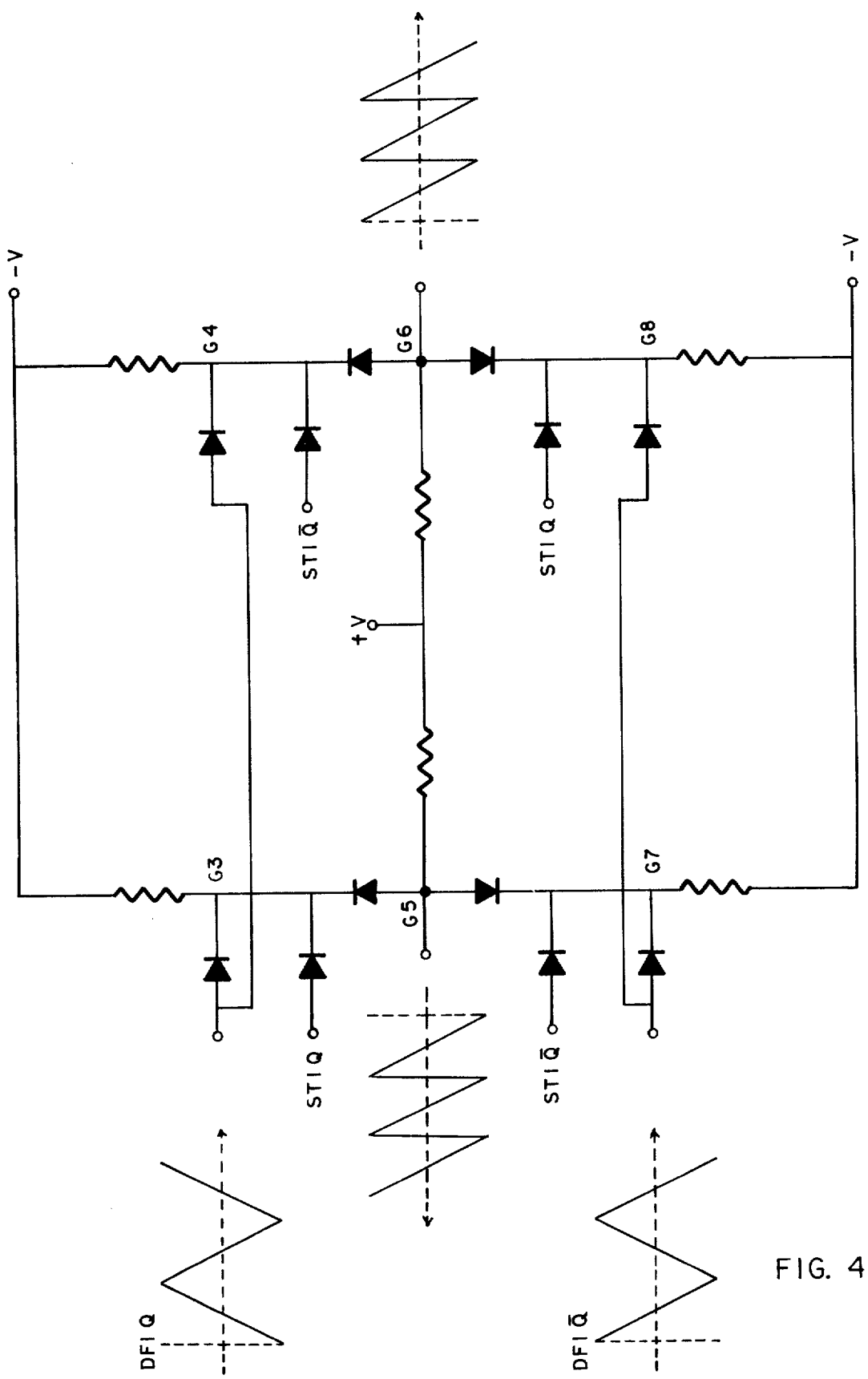

FIG. 4 is a component-schematic diagram of gates G3 through G8 with input and output voltage waveforms. Voltage waveform labels refer to block labels of FIG. 3. The output waveform of G6 is voltage as a function of time reading from left to right. The output of G5 is voltage as a function of time reading right to left.

Figure 2A:
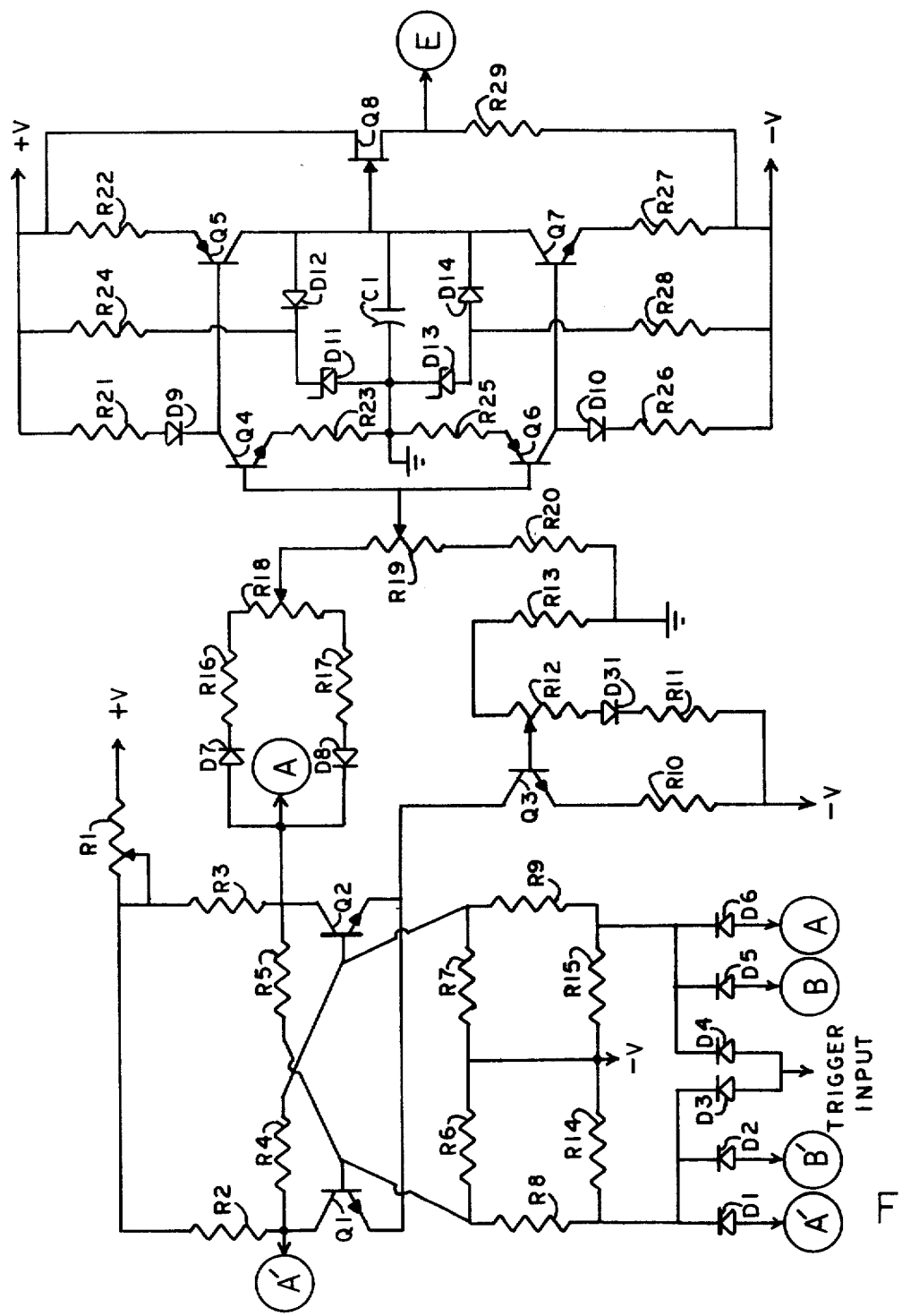
FIG. 2A, FIG. 2B is a component-schematic diagram showing the embodiment of the sawtooth waveform generator.

FF1 (FIG. 3), the bistable binary means is a nonsaturating flip-flop embodied by resistors R1 through R13, transistors Q1 through Q3 and diode D31 (FIG. 2A). Resistors R1 through R13 provide bias for the active elements Q1 through Q3. Diode D31 provides temperature compensation for Q3. R1 provides a means of adjusting the magnitude of the positive voltage output of FF1. R12 provides a means of adjusting the magnitude of the negative voltage output of FF1. One output of FF1 is applied to SC1. SC1 (FIG. 3), the symmetry and level control means, is a symmetry and frequency adjustment network embodied by resistors, R16 through R20 and diodes D7 through D8 (FIG. 2A). Diode D7 steers positive current through R16 and diode D8 steers negative current through R17. R18 balances the current from R16 and R17 and thereby provides a slope adjustment for the positive and negative slopes of the triangle waveform. R19 affects the magnitude of the negative and positive voltages applied to the bases of Q4 and Q6, equally providing a frequency adjust for the triangle waveform generator. The triangle waveform generator is embodied by CS1, CS2, CL1, CL2, C1 and SF1 (FIG. 3). CS1 is a positive constant current generating means, embodied by resistors R21 through R23, transistors Q4 through Q5 and Diode D9 (FIG. 2A). R21 through R23 provide bias for the active elements, Q4 through Q5. Diode D9 provides temperature compensation for Q5. CS1 supplies positive current to the timing element means, C1, the main timing capacitor, through the collector of Q5. Q4 switches Q5 on when there is a positive output from FF1 applied to the base of Q4. Q4 switches Q5 off when there is a negative output from FF1 applied to the base of Q4. The magnitude of the positive current output from Q5 is dependent on the magnitude of the positive voltage applied to the base of Q4. CS2 is a negative constant current generating means, embodied by resistors R25 through R27, transistors Q6 through Q7 and diode D10 (FIG. 2A). R25 through R27 provide bias for the active elements Q6 and Q7. Diode D10 provides temperature compensation for Q7. CS2 supplies negative current to C1 through the collector of Q7. Q6 switches Q7 on when there is a negative output from FF1 applied to the base of Q6. Q6 switches Q7 off when there is a positive output from FF1 applied to the base of Q6. The magnitude of the negative current output from Q7 is dependent on the magnitude of the negative voltage applied to the base of Q6. As the output of FF1 alternately switches from a positive voltage to a negative voltage, current sources, CS1 and CS2, alternately turn on and off with CS1 being on when CS2 is off, and CS2 being on when CS1 is off. When CS1 is on, C1 is charged, in a positive direction, developing a linearly increasing positive voltage with time. It is the function of CL1, the positive voltage clamping means, embodied by resistor R24 and diodes D11 through D12 (FIG. 2A), to limit the positive voltage across C1. When the voltage across C1 equals the positive voltage across D11 plus D12 the current from CS1 is diverted from C1 through D11 and D12 to prevent a further increase in the voltage developed across C1. When CS2 is on, C1 is charged in a negative direction, developing a linearly increasing negative voltage with time. It is the function of CL2, the negative voltage clamping means, embodied by resistor R28 and diodes D13 through D14 (FIG. 2A), to limit the negative voltage across C1. When the voltage across C1 equals the negative voltage across D13 plus D12 the current from CS2 is diverted from C1 through D13 and D14 to prevent a further increase in the voltage developed across C1. The voltage developed across C1, whether positive or negative, will remain at the clamp level until the charging current source is turned off and the opposing current source is turned on. The voltage source V1 (FIG. 3), for normal operation is equal to ground potential. Voltage source V1 can be used for D.C. voltage level shifting with a corresponding change in the clamp voltages.

The buffer amplifier means, SF1 (FIG. 3), embodied by transistor Q8 and resistor R29 (FIG. 2A) provides impedance conversion and isolation, of the voltage across C1 from ST1 and DF1.

The interaction of the outputs of FF1 and ST1 determine which current source is turned on, and hence in which direction C1 will be charged. The gates G1, the first positive logic ORing means, and G2, the second positive logic ORing means, (FIG. 3) are positive logic OR gates, embodied by resistor R14 and diodes D1 through D3 for G1 (FIG. 2A) and resistor R15 and diodes D4 through D6 for G2 (FIG. 2A). Gates G1 and G2 are current steering gates which determine which transistor (Q1 or Q2) will be turned off thereby enabling the opposite transistor. The inputs of gates G1 and G2 which are tied together and labeled TRIGGER INPUT, if high disable any change of FF1, if low enables or actually triggers a change in the state of the outputs of FF1 depending on the state of the outputs of ST1. Given that the output of FF1 which drives SC1 and is labeled A in FIG. 2A is positive and the input labeled TRIGGER INPUT is negative (low) C1 is charged in a positive direction. The following input conditions exist at gates G1 and G2; D1 input low, D2 input high, D3 input low, D4 input low, D5 input low and D6 input high. The input to D2 is derived from ST1 labeled B' (FIG. 2B) and it will be shown in the description of ST1 that the change in output B' of ST1 from high to low will turn Q1 off triggering the change in the state of FF1. ST1 (FIG. 3), the detector means, embodied by transistors Q9 through Q11, resistors R30 through R42, and diode D15 (FIG. 2B) form a differential trigger circuit and is used to detect when the voltage across C1 reaches the positive or negative clamp levels. The source voltage output of Q8 (point E, FIG. 2A) follows the positively charging voltage across C1 (with FF1 output A positive). At this point the voltage at the base of Q9 is less positive then the voltage at the base of Q10. Q9 is, therefore, off, its output labeled B' (FIG. 2B), is providing the high at the input of D2. When the voltage across C1 approaches the positive clamp voltage, the voltage at the base of Q9 exceeds the voltage at the base of Q10, as adjusted by R31, turning Q9 on and Q10 off. When the output of Q9 changes from a high to a low the input to D2 changes from a high to a low turning off Q1 and changing the state of FF1. With FF1 output A now negative (low) C1 is charged in a negative direction toward the negative clamp voltage. The source output of Q8 follows the voltage across C1. At this point the voltage at the base of Q9 is more positive then the voltage at the base of Q10. When the voltage across C1 approaches the negative clamp the voltage at the base of Q9 becomes less positive then the voltage at the base of Q10 and the state of the ST1 outputs change, which results in a corresponding change in the state of the outputs of FF1. This process of charging and discharging of C1 results in a triangular waveform being generated at the source output of Q8. If at any time the input labeled TRIGGER INPUT becomes high C1 will charge until it reaches the clamp voltage in the direction it was charging and hold there until the trigger input becomes a low.

Figure 2B:
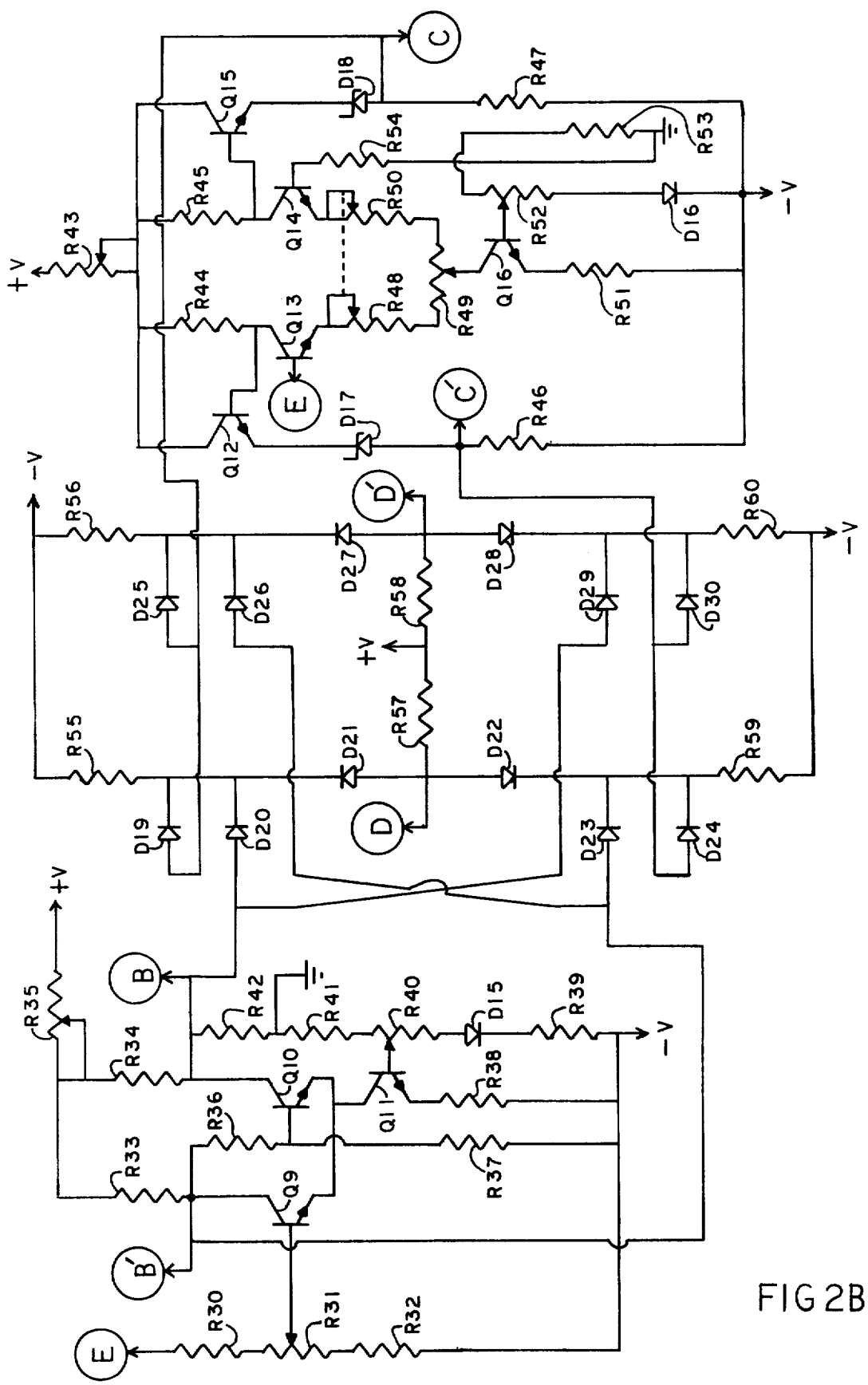

The triangular waveform produced at the output of SF1 is applied to the input of DF1 (FIG. 3). DF1, the inverting means is a differential amplifier embodied by transistors Q12 through Q16, resistors R43 through R54 and diodes D16 through D18 (FIG. 2B). R48 and R50 provide gain adjustment, R49 provides differential balance adjustment and R52 provide D.C. output level adjust. Diodes D17 and D18 provide D.C. output level shifting. It is the function of DF1 to provide a triangle output from the points labeled C' and C. The triangle output thus produced are separated in phase by 180°.

Figure 1:
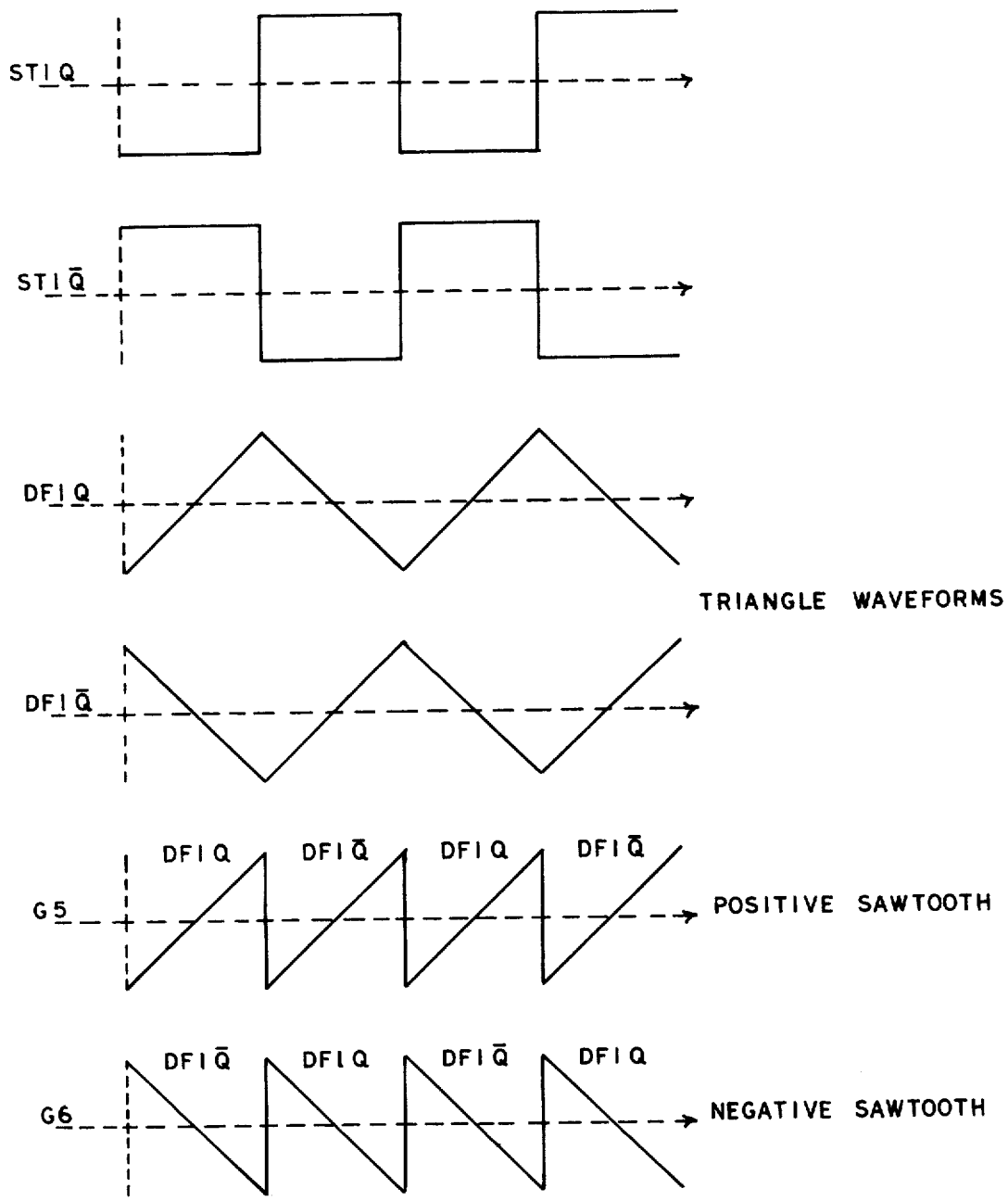
FIG. 1 is a waveform diagram showing the timing relationships of the triangle waveforms, the sawtooth waveforms and a associated switching waveforms. The waveforms labeled in FIG. 1 represent the waveforms of the outputs of the corresponding labeled devices of FIG. 3.

The generation of the sawtooth takes place within the switching means (gates G3 through G8 under the control of ST1 and DF1. G3, G4, G7 and G8) (FIG. 3) the positive logic OR gates embodied by; diodes D19 through D20 and resistor R55 (FIG. 2B) for G3, diodes D25 through D26 and resistor R56 (FIG. 2B) for G4, diodes D23 and D24 and resistor R59 (FIG. 2B) for G7 and diodes D29 and D30 and resistor R60 (FIG. 2B) for G8. G5 and G6 (FIG. 3) are positive logic AND gates embodied by diodes D21 and D22 and resistor R57 (FIG. 2B) for G5 and diodes D27 and D28 and resistor R58 (FIG. 2B) for G6. It is the function of G3 and G7 to apply that output of DF1 which has a positive slope to the input of G5. It is the function of G4 and G8 to apply that output of DF1 which has a negative slope to the input of G6. For a clearer understanding of the switching timing refer to FIG. 1 and FIG. 4. During the time that the input to G3, labeled DF1Q is proceeding with a positive slope ST1Q is negative, see first transition of ST1Q (FIG. 1). ST1$\overline{Q}$ is correspondingly positive (see FIG. 1). Under these conditions the input to G3, labeled DF1Q, is gated to the input of G5. The output of G7 is held positive by its input, labeled ST1$\overline{Q}$. Therefore, the output of G5 follows the most negative input which is the output of G3 proceeding with a positive slope, producing a sawtooth of positive slope at the output of G5. Likewise the output of G4 is held at a positive voltage and the output of G6 follow its most negative input, which is the output of G8 proceeding with a negative slope producing a sawtooth of negative slope at the output of G6. When the output states of ST1 alternate (ST1$\overline{Q}$ is negative and ST1Q is positive) the output of G5 follows its most negative input which is the output of G7, derived during the positive slope of the DF1$\overline{Q}$ input. The output of G6 follows its most negative input, which is the output of G4 derived from the negative slope of the DF1Q input. The outputs of G3 and G8 are held at a constant positive voltage by ST1Q.

The timing relationship for 4 cycles of sawtooth output can be seen in FIG. 1. The labeling of FIG. 1 corresponds to the block and output labeling of FIG. 3.

It can be seen from FIG. 4 that the short transition time of the output of G5 from positive to negative and G6 from negative to positive, is limited only by the switching speed of the diodes of gates G3 through G8 and the rise and fall times of ST1Q and ST1$\overline{Q}$. This offers an advantage over previous art which, in addition to the rise and fall time limitations, is limited by the inherently slower switching speeds of transistors.

The voltage drop through the diode matrix is self-cancelling in that, for any slope, the voltage path is through two diodes, one diode voltage drop being subtractive and one diode voltage drop being additive. This cancelling also provides a measure of temperature compensation through the diode matrix. It should be noted that positive and negative peak voltages of DF1Q, DF1Q̄, ST1Q and ST1Q̄ of FIG. 4 are equal in magnitude.

The input of FIG. 2A and FIG. 3 labeled TRIGGER INPUT, is the external trigger input means, it is derived from the device in which the invention is incorporated. The TRIGGER INPUT signal is a voltage level which is either positive or negative. The magnitude of the positive or negative voltage should be equal to the positive and negative voltage output from FF1 or ST1. If the TRIGGER INPUT is positive the sawtooth waveform is disabled. If the TRIGGER INPUT is negative the sawtooth waveform is enabled or triggered.

Referring to FIGS. 2A and 2B, the encircled designators refer to common connection points of like designators. For example, the points labeled E on FIG. 2A and FIG. 2B are considered connections and thereby the same point. The points labeled D and D' (FIG. 2B) are the positive and negative sawtooth outputs of gates G5 and G6 respectively. The points labeled $-V$ and $+V$ refer to the D.C. power supply connection points. All $+V$ points are common connections and all $-V$ points are common connectons.

What is claimed is:

1. A device, for generating a first and a second sawtooth waveform derived from a first and a second triangle waveform, comprising a positive constant current generating means having an output and an input, a negative constant current generating means having an output and an input, a timing element means having a first end and a second end, a positive voltage clamping means having a first end and a second end and a third end, a negative voltage clamping means having a first end and a second end and a third end, a buffer amplifier means having an input and an output, a detector means having an input and a first output and second output, and inverting means having an input and a first output and second output, a switching means having a first input through and including an eighth input and a first output and second output, a first positive logic ORing means having a first input through and including a third input and an output, a second positive logic ORing means having a first input through and including a third input and an output, a bistable binary means having a first input and a second input and a first output and a second output, an external trigger input means having an output, and a symmetry and level control means having a first input and a second input and an output, the outputs of the positive and negative constant current generating means are connected together and to the first end of the timing element means and to the first end of the positive voltage clamping means and to the first end of the negative voltage clamping means and to the input of the buffer amplifier means, the second end of the timing element means is connected to ground, the second ends of the positive and negative voltage clamping means are connected together and to ground, the third end of the positive voltage clamping means is connected to a positive source of voltage, the third end of the negative voltage clamping means is connected to a negative source of voltage, the output of the buffer amplifier means is connected to the input of the detector means and to the input of the inverting means, the first output of the inverting means is connected to the first input and the third input of the switching means, the second output of the inverting means is connected to the sixth input and the eighth input of the switching means, the first output of the detector means is connected to the second input and the seventh input of the switching means and to the first input of the first ORing means, the second output of the detector means is connected to the fourth input and the fifth input of the switching means and to the first input of the second ORing means, the output of the external trigger input means is connected to the second inputs of the first and second ORing means, the output of the first ORing means is connected to the first input of the bistable binary means, the output of the second ORing means is connected to the second input of the bistable binary means, the first output of the bistable binary means is connected to the third input of the first ORing means and to the first and second inputs of the symmetry and level control means, the second output of the bistable binary means is connected to the third input of the second ORing means, the output of the symmetry and level control means is connected to the inputs of the positive and negative constant current generating means, the first output of the switching means produces the first sawtooth waveform, and the second output of the switching means produces the second sawtooth waveform.

2. A device as claimed in claim 1, wherein the inverting means comprises, a differential amplifier having an input and a first output and a second output, a first level shifting means having an input and an output, and a second level shifting means having an input and an output, the input of the differential amplifier is the input of the inverting means and is connected to the output of the buffer amplifier means, the first output of the differential amplifier is connected to the input of the first level shifting means, the second output of the differential amplifier is connected to the input of the second level shifting means, the output of the first level shifting means is the first output of the inverting means and provides a triangle waveform voltage in phase to the first triangle waveform voltage, the output of the second level shifting means is the second output of the inverting means and provides a second triangle waveform voltage differing in phase from the first triangle waveform voltage by 180°.

3. A device as claimed in claim 2, wherein the first and second level shifting means each comprise, a transistor, a resistor and a voltage reference diode, the emitter end of the transistor is connected to the cathode end of the voltage reference diode, the anode end of the voltage reference diode is connected to the first end of the resistor, the second end of the resistor is connected to a source of negative voltage, the collector end of the transistor is connected to a source of positive voltage, the base end of the transistor is the input of the level shifting means, and the connection point of the anode end of the voltage reference diode to the first end of the resistor is the output of the level shifting means.

4. A device as claimed in claim 1, wherein the detector means comprises a differential comparator having first and second inputs and first and second outputs, the first input of the differential comparator is the input of the detector means, the second input of the differential comparator is connected to the second output of the differential comparator, the first output of the differential comparator is the first output of the detector means, and the second output of the differential comparator is the second output of the detector means, the first and second outputs of the differential comparator provide a first and second phase opposed bilevel control output voltages, the first level of which is produced in response to a condition wherein the peak positive voltage at the first input of the differential comparator is greater than the positive voltage level at the second input of the differential comparator, and the second level of which responds to a condition wherein the peak negative voltage level at the first input of the differential comparator is greater than the negative voltage level at the second input of the differential comparator.

5. A device as claimed in claim 1, wherein the bistable binary means comprises a differential bistable binary flip-flop, having first and second inputs and first and second outputs, the first and second inputs of the differential bistable binary flip-flop corresponds, respectively, to the first and second inputs of the bistable binary means, the first and second outputs of the differential bistable binary flip-flop corresponds, respectively, to the first and second outputs of the bistable binary means, the differential bistable binary flip-flop is differential in that whichever input, first or second, is less positive the corresponding output, first or second, will be at a logic "1" or most positive, the first input of the differential bistable binary flip-flop is connected to the output of the first positive logic ORing means, a logic "$\phi$" at the output of the first positive logic ORing means will force the first output of the differential bistable binary flip-flop to a logic "1" this in turn will force the second output of the differential bistable binary flip-flop to a logic "$\phi$", the second input of the differential bistable binary flip-flop is connected to the output of the second positive logic ORing means, a logic "$\phi$" at the output of the second positive logic ORing means will force the second output of the differential bistable binary flip-flop to a logic "1" this in turn will force the first output of the differential bistable binary flip-flop to a logic "$\phi$", the first and second outputs of the differential bistable binary flip-flop are connected to the third inputs of the first and second positive logic ORing means respectively thus assuring that a logic "$\phi$" can only appear at the output of only one of the positive logic ORing means at one time.

6. A device as claimed in claim 1, wherein the first and second positive logic ORing means each comprise a diode resistor OR gate having three inputs, the first positive logic ORing means provides an output connected to the first input of the bistable binary means such that a high is produced at the first output of the bistable binary means when all the inputs to the first ORing means are low, the second positive logic ORing means provides an output to the second input of the bistable binary means such that a high is produced at the second output of the bistable binary means when all the inputs to the second ORing means are low.

7. A device as claimed in claim 1, wherein the symmetry and level control means comprises a first diode, a first resistor, a second diode, a second resistor, a first potentiometer, a second potentiometer, and a third resistor, the anode of the first diode is the first input of the symmetry and level control means, the cathode of the second diode is the second input of the symmetry and level control means, the third end or the wiper of the second potentiometer is the output of the symmetry and level control means, the anode of the first diode is connected to the cathode of the second diode and to the first output of the bistable binary means, the third end of the second potentiometer is connected to the inputs of the positive and negative constant current generating means, the cathode of the first diode is connected to the first end of the first resistor, the second end of the first resistor is connected to the first end of the first potentiometer, the anode of the second diode is connected to the first end of the second resistor, the second end of the second resistor is connected to the Second end of the first potentiometer, the third end of the first potentiometer is connected to the first end of the second potentiometer, the second end of the second potentiometer is connected to the first end of the third resistor, the second end of the third resistor is connected to ground.

8. A device as claimed in claim 1, wherein the switching means comprises, a first positive logic OR gating means, a second positive logic OR gating means, a third positive logic OR gating means, a fourth positive logic OR gating means, a first positive logic AND gating means, and a second positive logic AND gating means, the first and second inputs of the first OR gating means are connected to the first triangle waveform voltage and to the first output of the detector means respectively, the output of the first OR gating means follows the LOW to HIGH transition of the first triangle waveform voltage when the first output of the detector means is LOW the output of the first OR gating means remains at a constant HIGH during the HIGH to LOW transition of the first triangle waveform voltage when the first output of the detector means is HIGH, the first and second inputs of the third OR gating means are connected to the second triangle waveform voltage and to the second output of the detector means respectively, the output of the third OR gating means follows the LOW to HIGH transition of the second triangle waveform voltage when the second output of the detector is LOW, the output of the third OR gating means remains at a constant HIGH during the HIGH to LOW transition of the second triangle waveform voltage when the second output of the detector means is HIGH, the first and second inputs of the first AND gating means are connected to the outputs of the first and third OR gating means respectively, the output of the first AND gating means follows the LOW to HIGH transition of the first OR gating means output when the output of the third OR gating means is at a constant HIGH, the output of the first AND gating means follows the LOW to HIGH transition of the third OR gating means output when the output of the first OR gating means is at a constant HIGH, therefore, the output of the first AND gating means alternately follows the outputs of the first and third OR gating means thus providing a positive slope sawtooth waveform voltage the LOW to HIGH transition being a substantial portion of the cycle and the HIGH to LOW transition being a small fraction of the cycle, the first and second inputs of the second OR gating means are connected to the first triangle waveform voltage and to the second output of the detector means respectively, the output of the second OR gating means follows the HIGH to LOW transition of the first triangle waveform voltage when the second output of the detector means is LOW, the output of the second OR gating means remains at at constant HIGH during the LOW to HIGH transition of the first triangle waveform voltage when the second output of the detector means is HIGH, the first and second inputs, to the fourth OR gating means are connected to the second triangle waveform voltage and to the first output of the detector means respectively, the output of the fourth OR gating means follows the HIGH to LOW transition of the second triangle waveform voltage when the first output of the detector means is LOW, the output of the fourth OR gating means remains at a constant HIGH during the LOW to HIGH transition of the second triangle waveform voltage when the first output of the detector means is HIGH, the first and second inputs of the second AND gating means are connected to the outputs of the second and fourth OR gating means respectively, the output of the second AND gating means follows the HIGH to LOW transition of the second OR gating means output when the output of the fourth OR gating means is at a constant HIGH, the output of the second AND gating means follows the HIGH to LOW transition of the fourth OR gating means output when the output of the second OR gating means is at a constant HIGH, therefore, output of the second AND gating means alternately follows the outputs of the second and fourth OR gating means thus providing a negative slope sawtooth waveform voltage the HIGH to LOW transition being a substantial portion of the cycle and the LOW to HIGH transition being a small fraction of the cycle.

9. A device as claimed in claim 1, wherein the switching means comprises a first resistor, a second resistor, a third resistor, a fourth resistor, a fifth resistor, a sixth resistor, a first diode, a second diode, a third diode, a fourth diode, a fifth diode, a sixth diode, a seventh diode, an eighth diode, a ninth diode, a tenth diode, an eleventh diode and a twelfth diode, wherein the cathodes of the first and second diodes are connected together and to the cathode of the ninth diode and to the first end of the first resistor, the cathodes of the third and fourth diodes are connected together and to the cathode of the eleventh diode and to the first end of the second resistor, the cathodes of the fifth and sixth diodes are connected together and to the cathode of the tenth diode and to the first end of the third resistor, the cathodes of the seventh and eighth diodes are connected together and to the cathode of the twelfth diode and to the first end of the fourth resistor, the anodes of the ninth and tenth diodes are connected together and to the first end of the fifth resistor, the anodes of the eleventh and twelfth diodes are connected together and to the first end of the sixth resistor, the second ends of the first through fourth resistors are connected together and to the negative voltage supply, the second ends of the fifth and sixth resistors are connected together and to the positive voltage supply, the anodes of the first and third diodes are connected together and to the first triangle waveform voltage, the anodes of the second and seventh diodes are connected together and to the first output of the detector means, the anodes of the fourth and fifth diodes are connected together and to the second output of the detector means, the anodes of the sixth and eighth diodes are connected together and to the second triangle waveform, the connection point of the anodes of ninth and tenth diodes is the positive slope sawtooth output, the connection point of the anodes of the eleventh and twelfth diodes is the negative slope sawtooth output.

* * * * *